(12) United States Patent
Gross et al.

(10) Patent No.: US 9,117,588 B2
(45) Date of Patent: Aug. 25, 2015

(54) COMBINATION CONVERTER ARRANGEMENT AND SWITCHING DEVICE

(71) Applicants: Markus Gross, Poppenricht (DE); Thomas Kiendl, Wernberg-Koeblitz (DE)

(72) Inventors: Markus Gross, Poppenricht (DE); Thomas Kiendl, Wernberg-Koeblitz (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 143 days.

(21) Appl. No.: 13/756,678

(22) Filed: Feb. 1, 2013

(65) Prior Publication Data

US 2013/0207638 A1 Aug. 15, 2013

(30) Foreign Application Priority Data

Feb. 10, 2012 (DE) .......................... 10 2012 201 992

(51) Int. Cl.
| | |
|---|---|
| *H01F 38/32* | (2006.01) |
| *H01F 38/30* | (2006.01) |
| *H01F 27/30* | (2006.01) |
| *H01F 27/02* | (2006.01) |

(52) U.S. Cl.
CPC ............... *H01F 38/32* (2013.01); *H01F 27/30* (2013.01); *H01F 38/30* (2013.01); *H01F 27/02* (2013.01)

(58) Field of Classification Search
CPC ......... H01F 27/02; H01F 27/30; H01F 38/30; H01F 38/32
USPC ................... 361/45, 93.1, 93.5, 111, 115, 64; 324/96, 126, 127, 530, 629; 323/355–360
See application file for complete search history.

(56) References Cited

U.S. PATENT DOCUMENTS

| | | | | |
|---|---|---|---|---|
| 4,369,490 | A | * | 1/1983 | Blum .............................. 363/48 |
| 4,796,027 | A | * | 1/1989 | Smith-Vaniz ............ 340/870.03 |
| 4,887,029 | A | * | 12/1989 | Hemminger ................... 324/142 |
| 5,982,265 | A | | 11/1999 | Von Skarczinski et al. |
| 6,295,190 | B1 | | 9/2001 | Kasson |
| 6,452,343 | B2 | * | 9/2002 | Oostvogels et al. ....... 315/209 R |
| 6,608,770 | B2 | * | 8/2003 | Vinciarelli et al. ............. 363/61 |
| 6,754,059 | B2 | * | 6/2004 | Bach et al. .................... 361/93.1 |
| 7,567,074 | B2 | * | 7/2009 | Mas et al. ................. 324/117 R |
| 2003/0001702 | A1 | | 1/2003 | Bach et al. |
| 2005/0253573 | A1 | | 11/2005 | Budillon |

(Continued)

FOREIGN PATENT DOCUMENTS

| | | |
|---|---|---|
| CN | 1395755 A | 2/2003 |
| CN | 101345126 A | 1/2009 |
| DE | 30 12 766 A1 | 10/1981 |

(Continued)

*Primary Examiner* — Rajnikant Patel
(74) *Attorney, Agent, or Firm* — Harness, Dickey & Pierce, P.L.C.

(57) ABSTRACT

A combination converter arrangement and a switching device including such a combination converter arrangement are disclosed. The combination of a current transformer with a core made of ferromagnetic material and a Rogowski coil is referred to as a combination converter, the current transformer being used to supply energy to the electronic tripping unit of the switching device, and the Rogowski coil being used to measure current. In order to make use of the installation space available in the switching device for installing combination converters, a plurality of combination converters are arranged in a common housing to thereby provide a multi-pole combination converter module.

15 Claims, 4 Drawing Sheets

(56) References Cited

U.S. PATENT DOCUMENTS

2006/0290454 A1  12/2006  Mas et al.
2012/0049839 A1*  3/2012  Kiendl .......................... 324/127

FOREIGN PATENT DOCUMENTS

| | | |
|---|---|---|
| DE | 195 05 812 A1 | 8/1996 |
| DE | 100 04 833 A1 | 8/2001 |
| DE | 60 2006 000 237 T2 | 4/2008 |
| EP | 2015320 A1 | 1/2009 |
| EP | 2 402 769 A1 | 1/2012 |
| KR | 20110047709 A | 5/2011 |
| WO | WO 2009/139521 A1 | 11/2009 |

* cited by examiner

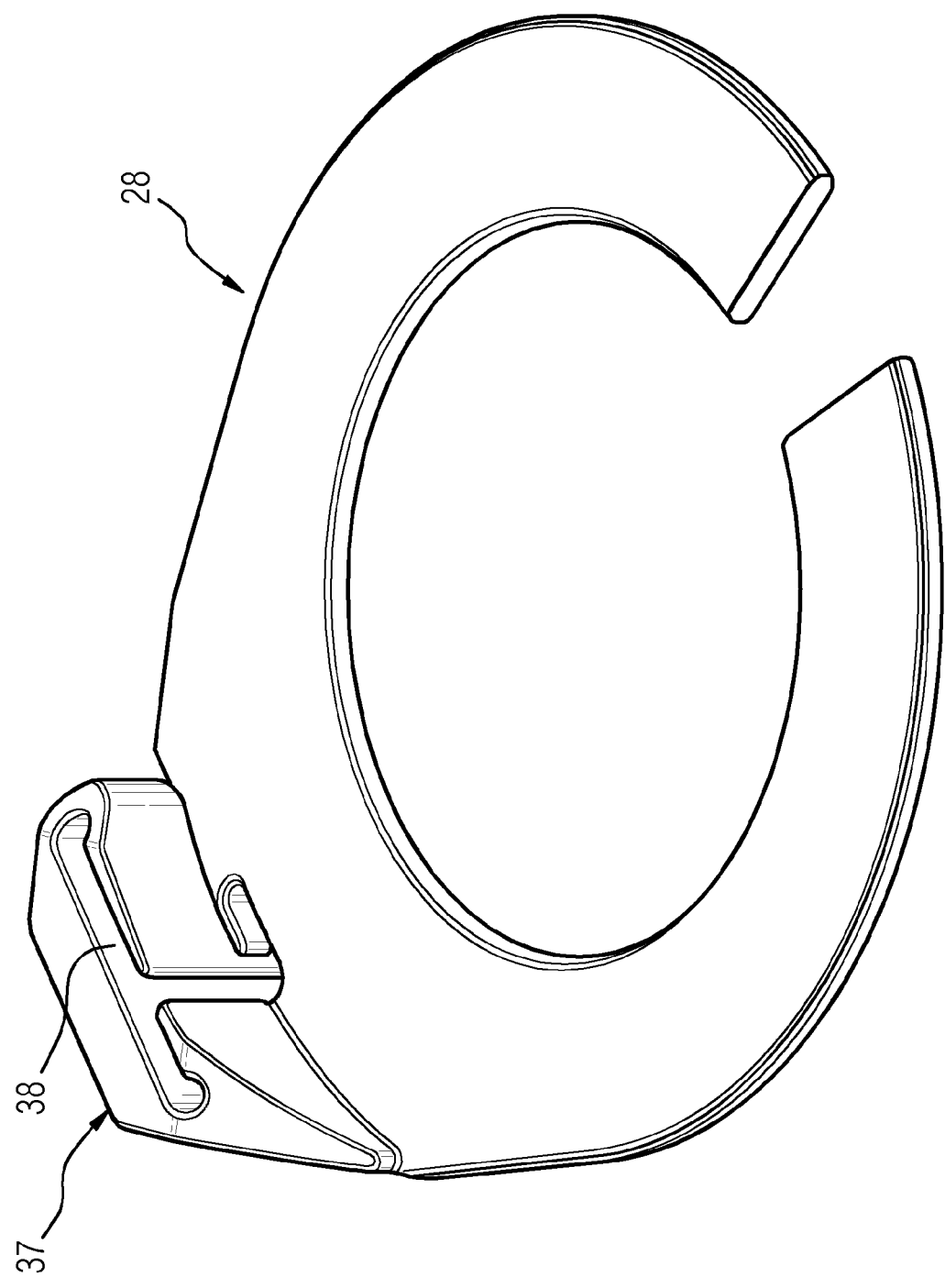

COMBINATION CONVERTER ARRANGEMENT AND SWITCHING DEVICE

PRIORITY STATEMENT

The present application hereby claims priority under 35 U.S.C. §119 to German patent application number DE 10 2012 201 992.8 filed Feb. 10, 2012, the entire contents of which are hereby incorporated herein by reference.

FIELD

At least one embodiment of the invention generally relates to a combination converter arrangement and/or to a switching device including such a combination converter arrangement.

BACKGROUND

Switching devices with an electronic tripping unit, which have an iron-cored current transformer and a Rogowski coil for each phase, are known. The iron-cored current transformer is used to supply energy to the electronic tripping unit. The output voltage of the Rogowski coil is proportional to the time derivative of the current in the conductor contained in the Rogowski coil. This output voltage is used to detect the temporal profile of the current in the conductor in the electronic tripping unit.

The combination of the iron-cored current transformer and the Rogowski coil is referred to as a combination converter below. Combination converters are generally used in low-voltage circuit-breakers with rated currents in the range of approximately 25 A to 6300 A and make it possible to measure currents in the range of a few amperes to greater than 100 kA. In this case, a separate combination converter with a housing is used for each phase of the circuit-breaker.

The required air gaps and leakage paths between the individual phases, on the one hand, and between the phases and the electronic tripping unit, on the other hand, are complied with by the housings which are used as separating elements. In addition, this design makes it possible to flexibly equip the circuit-breakers with combination converters depending on whether a two-pole, three-pole or four-pole embodiment is involved.

SUMMARY

An embodiment of the present invention makes optimum use of the installation space available in a switching device for installing combination converters. A combination converter arrangement and a switching device are disclosed. Advantageous embodiments of the invention are stated in the subclaims.

In at least one embodiment of the invention, a plurality of combination converters are arranged in a common housing to thereby provide a multi-pole combination converter module. At least one embodiment of the invention can be used in a particularly advantageous manner in the low-voltage range.

In particular, the combination converter arrangement according to at least one embodiment of the invention can be used to implement self-powered low-voltage circuit-breakers with an electronic tripping unit, in which the use of Rogowski coils and the high degree of current measurement accuracy which can be achieved thereby make it possible to implement not only very accurate protective functions, for instance overload and short-circuit protection, but also very accurate measuring functions, for instance the measurement and representation of the current and, in combination with a voltage tap, the measurement of the active, reactive and apparent power.

BRIEF DESCRIPTION OF THE DRAWINGS

The above-described properties, features and advantages of embodiments of this invention and the manner in which they are achieved become more clearly and distinctly understandable in connection with the following description of the example embodiments which are explained in more detail in connection with the drawings, in which:

FIG. 4 shows a perspective illustration of the spacer with a soldering aid.

All figures show the invention only in a schematic manner and with its essential parts. In this case, identical reference symbols correspond to elements with an identical or comparable function.

DETAILED DESCRIPTION OF THE EXAMPLE EMBODIMENTS

Figure 1:
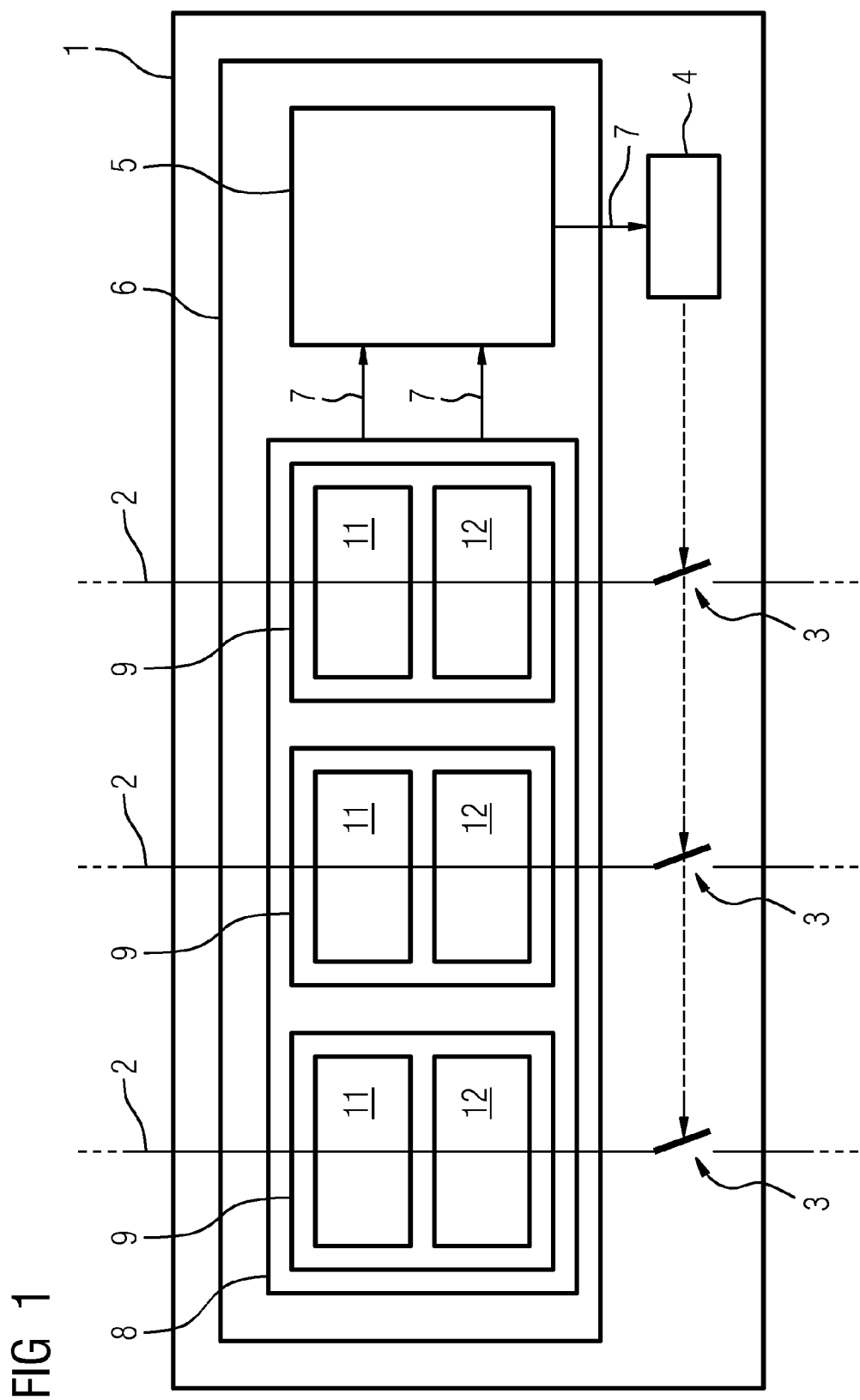
FIG. 1 shows a simplified block diagram of a low-voltage circuit-breaker.

The present invention will be further described in detail in conjunction with the accompanying drawings and embodiments. It should be understood that the particular embodiments described herein are only used to illustrate the present invention but not to limit the present invention.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

Specific structural and functional details disclosed herein are merely representative for purposes of describing example embodiments of the present invention. This invention may, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

In at least one embodiment of the invention, a plurality of combination converters are arranged in a common housing to thereby provide a multi-pole combination converter module. At least one embodiment of the invention can be used in a particularly advantageous manner in the low-voltage range.

In particular, the combination converter arrangement according to at least one embodiment of the invention can be used to implement self-powered low-voltage circuit-breakers with an electronic tripping unit, in which the use of Rogowski coils and the high degree of current measurement accuracy which can be achieved thereby make it possible to implement not only very accurate protective functions, for instance overload and short-circuit protection, but also very accurate measuring functions, for instance the measurement and representation of the current and, in combination with a voltage tap, the measurement of the active, reactive and apparent power.

Since the protective function of the circuit-breaker must be active both during multi-phase operation and during single-phase operation of the self-powered circuit-breaker, only current transformers with a core made of a ferromagnetic material, for example an iron core, are suitable for supplying energy to the electronic tripping unit. Rogowski coils are preferably used to measure the primary current through the main current paths of the circuit-breaker in a saturation-free and thus distortion-free manner.

A Rogowski coil is a coil without a ferromagnetic core which is used to measure alternating current. In one example embodiment of the invention, both coils have an annular core. The best possible use can therefore be made of the installation space available in the switching device or the receiving space accordingly predefined by the housing. At the same time, the ring shape of the cores makes it possible to place the current transformer and the Rogowski coil in the housing in a particularly simple and safe manner.

For this purpose, the housing has a mounting element for each phase in one example embodiment of the invention. Each mounting element has a continuous interior and is used as a carrier for the current transformer and the Rogowski coil. In the final mounting state, the respective conductor runs through the mounting element and therefore also the preferably annular cores of the current transformer and of the Rogowski coil. If a circular cross section is selected both for the cores of the current transformer and of the Rogowski coil and for the mounting element, for example if the mounting element is in the form of an internally hollow dome, the current transformers only need to be pushed onto the mounting element and fixed there if necessary for mounting purposes. A round cross section of the mounting element is adapted to the conductor cross sections of the busbars which are usually round, in particular, for low-voltage circuit-breakers for low rated currents. However, the mounting elements are advantageously designed such that conductors with a rectangular cross section can also be guided through the housing.

A spacer is advantageously arranged between the current transformer and the Rogowski coil. The spacers which are preferably produced from a thermally and/or electrically non-conductive plastic material, for example in the form of a disk, prevent the current transformer and the Rogowski coil from touching. Since the diameters of the wire windings of the Rogowski coil and of the current transformer differ considerably from one another, the spacer is also simultaneously used as a protective element since it prevents mutual mechanical or electromagnetic interaction between the two windings.

In another embodiment of the invention, possibly in addition to the spacer arranged between the current transformer and the Rogowski coil, a spacer is arranged on the outer side of the current transformer and/or of the Rogowski coil. This spacer is likewise used to protect the windings.

In another advantageous embodiment of the invention, the spacer provided between the current transformer and the Rogowski coil and/or the spacer provided on one of the outer sides of the current transformer and/or of the Rogowski coil perform(s) a multiple function. At least one of the spacers may thus be simultaneously used to hold the current transformer and the Rogowski coil in their installation position, in particular from the time at which the current transformer and/or the Rogowski coil is/are pushed onto the mounting element, until the housing is filled with a filling material, as is described in detail further below. For this purpose, this spacer is provided with connecting elements, preferably in the form of clamping, latching or snap-action elements or the like, which interact with the mounting element or with corresponding connecting elements provided on the mounting element.

In another advantageous embodiment of the invention, a spacer associated with the Rogowski coil and/or the current transformer has a holder to which it is possible to fix the solder or crimp connection between the enameled wire of the Rogowski coil and/or of the current transformer and a stranded wire of considerably larger cross section for connection to the electronic module.

In a very particularly advantageous embodiment of the invention, the empty spaces or cavities of the housing which remain after the installation of the current transformers and of the Rogowski coils are at least partially filled with an ideally electrically non-conductive filling material. The filling material preferably also closes the housing, with the result that an additional construction element, such as a cover or the like, is not needed to close the housing. The filling material preferably completely surrounds the components arranged in the housing in the manner of an encapsulation. The filling material is preferably a potting compound which is used to pot the combination converter arrangement after the installation of the current transformers and Rogowski coils.

In connection with the use of an electrically insulating plastic material for the housing of the combination converter arrangement, in which case the wall thickness of the plastic housing is preferably at least approximately 1 mm, the filling material ensures optimum insulation between the main current paths of the circuit-breaker and the current transformers and Rogowski coils and between the main current paths and the electronic tripping unit electrically connected to the current transformers and Rogowski coils. This is particularly important in those circuit-breakers in which the electronic tripping unit has a connection for communicating with other circuit-breakers or a superordinate control unit. The electronic tripping unit can use this communication link, for example, to receive protection parameters to be set and to transmit measured values of current, voltage and power. In these cases, reliable isolation between the main current path and the circuits in the electronic tripping unit must be ensured.

It is particularly advantageous that the use of the filling material dispenses with the need to provide partitions between the individual phases in the housing. This reduces not just the design complexity and thus the production costs. The external diameters of the current transformers can also be selected to be comparatively large, with positive effects on the structure and thus the electrical transmission properties of the current transformers and Rogowski coils.

If the filling material is thermally conductive, it ensures that the heat produced in the secondary winding is dissipated to the environment. Impermissibly high temperatures in the secondary winding and in the combination converter arrangement on the whole can thus be avoided. Such heating may result from the power loss produced in the secondary windings of the iron-cored current transformer when a current flows.

In comparison with the solutions which are partially very complex in terms of design and are thus expensive, as are known from the prior art, at least one embodiment of the invention provides a comparatively simple and cost-effective combination converter arrangement. Both assembly, in particular the installation of the current transformers and Rogowski coils in the housing, and the introduction of the filling material, in particular by potting the combination converter module, can be carried out in a comparatively cost-effective manner. The result is a very compact combination converter module which can be transported, installed and operated with a very low risk of damage. Incorrect connection of the combination converters with incorrect assignment of the phase to the electronics during production is also excluded by the modular design.

In summary, the arrangement according to at least one embodiment of the invention is very robust, simple to produce, cost-effective and has very good electrical insulation properties. In comparison with three individual combination converters, as are used, for example, to equip a three-phase circuit-breaker in the prior art, the combination converter arrangement presented results in a cost advantage.

At least one embodiment of the invention can be used in a particularly advantageous manner in low-voltage circuit-breakers. These may be both molded case circuit-breakers (MCCB) and air circuit-breakers (ACB).

A combination converter arrangement and a low-voltage circuit-breaker with such a combination converter arrangement are described below by way of example.

The circuit-breaker 1 depicted in FIG. 1 is designed to switch three electrical conductors 2 with the aid of switching contacts 3. The switching contacts 3 can be actuated via a tripping mechanism 4. The electronic tripping unit 6 of the circuit-breaker 1 comprises an electronic module 5 and a combination converter module 8. The tripping mechanism 4 is driven by the electronic module 5 on the basis of a current value. For this purpose, the electronic module 5 is connected to the tripping mechanism 4, on the one hand, and to a combination converter module 8 according to an embodiment of the invention, on the other hand, via connecting lines 7.

The combination converter module 8 is used both to detect the current in the three conductors 2 and to supply the electronic module 5 with energy. For this purpose, it includes three combination converters 9 which are arranged in a common housing 10 made of plastic material. Each combination converter 9 has a Rogowski coil 11 for measuring current and an iron-cored current transformer 12 for supplying energy to the electronic module 5. The Rogowski coil 11 provides, as an output signal, an electrical voltage which is proportional to the temporal change in the current in the conductor 2 contained in the Rogowski coil 11. The temporal profile and the root-mean-square value of the current in the conductor 2 are determined from this voltage signal in the electronic module 5 of the electronic tripping unit 6 using analog signal processing and a downstream microcontroller with an analog/digital converter. If the temporal profile of the current or the root-mean-square value exceeds a defined threshold value for a particular period of time, the tripping mechanism 4 is driven by the electronic module 5 and the switching contacts 3 are opened thereby.

Figure 2:
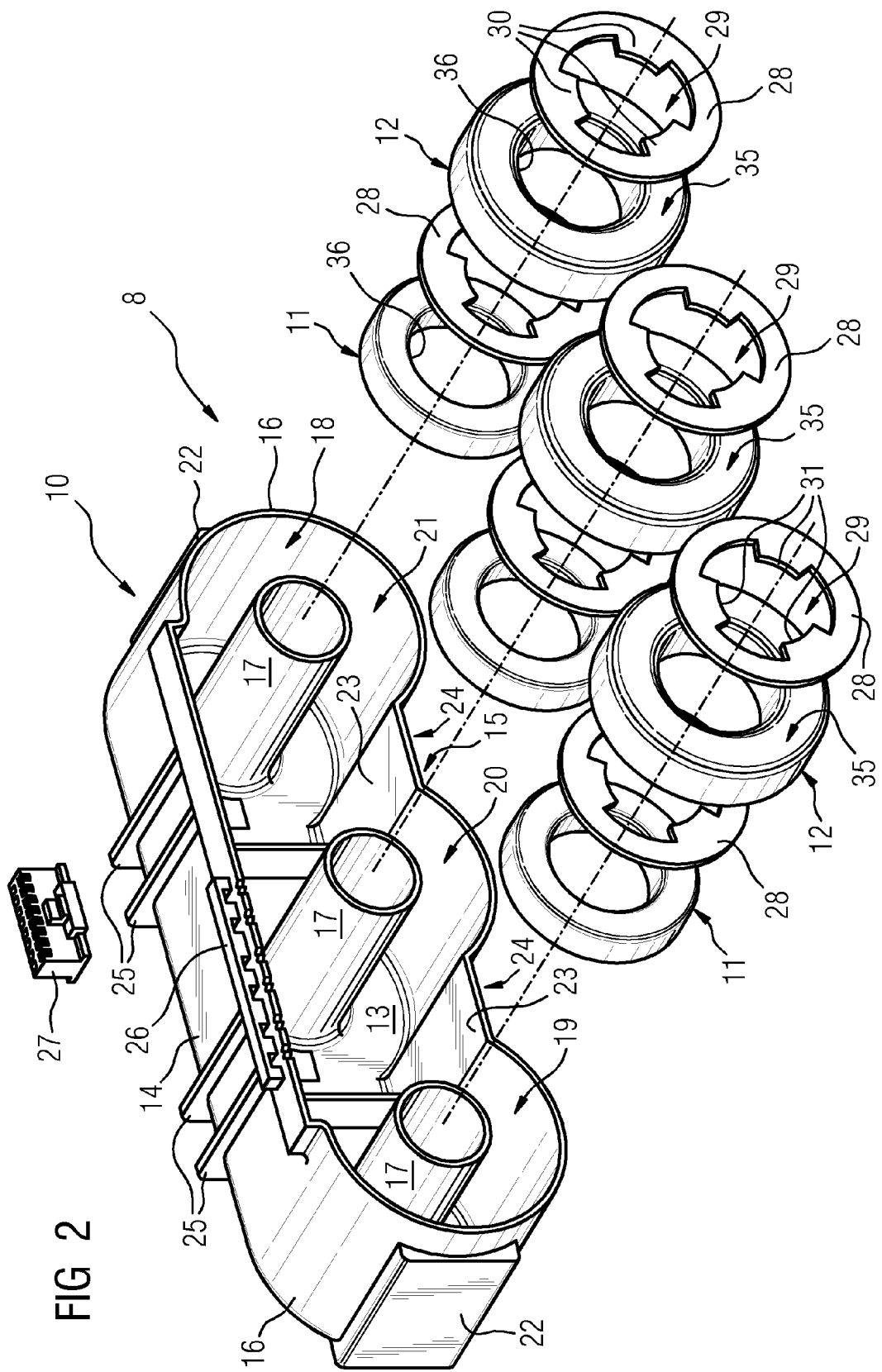
FIG. 2 shows an exploded illustration of a combination converter arrangement.
Figure 3:
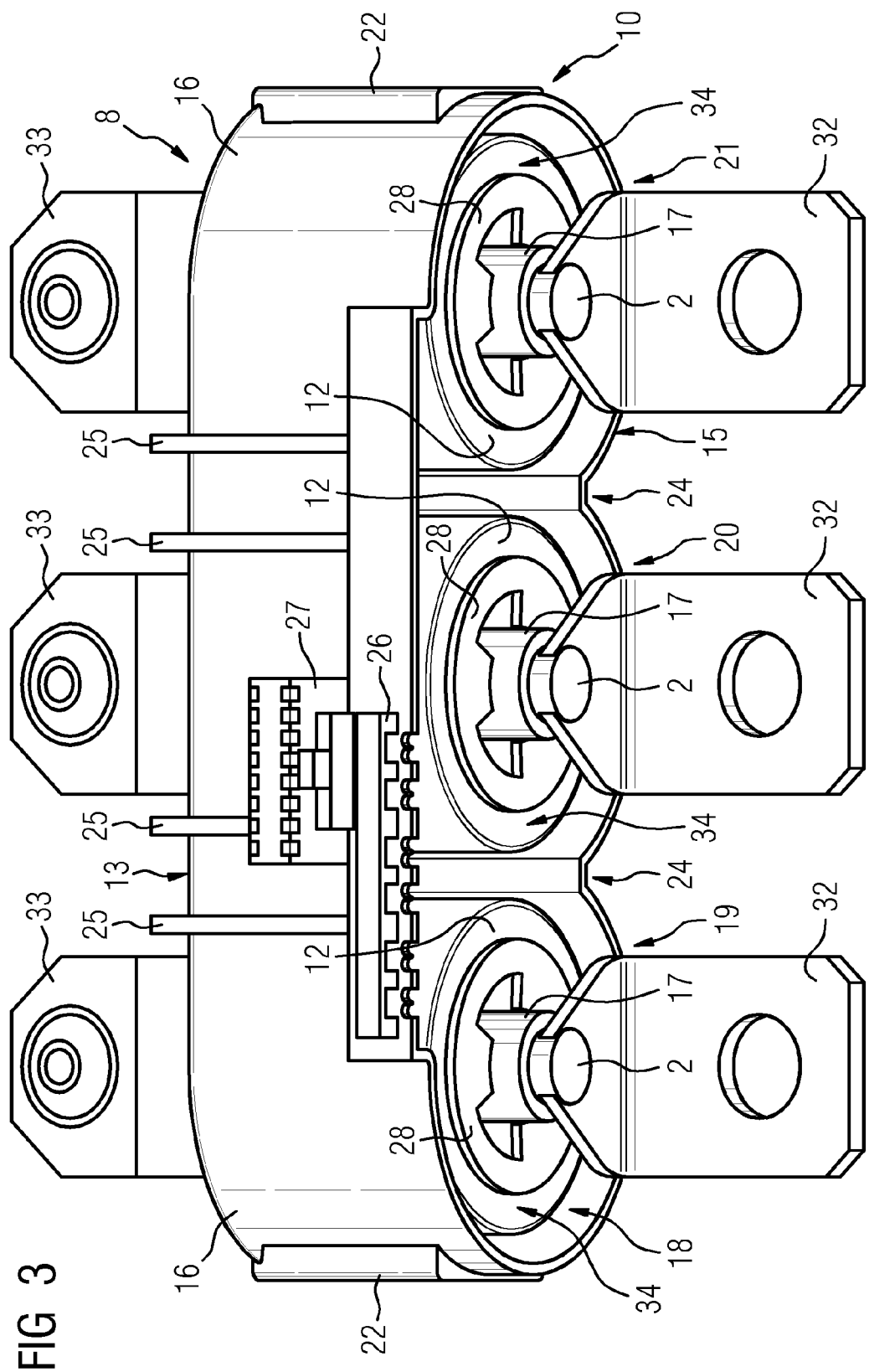
FIG. 3 shows a perspective illustration of the combination converter arrangement with busbars.

As illustrated in FIGS. 2 and 3, the housing 10 of the combination converter module 8 substantially consists of a rear wall 13, a housing cover 14 adjoining the rear wall 13, a housing base 15 which adjoins the rear wall 13 and is opposite the housing cover 14 and two side walls 16 which adjoin the rear wall 13 and connect the housing base 15 to the housing cover 14. Three mounting elements 17 in the form of domes extend from the rear wall 13 in the direction of the open housing front side 18. The mounting elements 17 internally provided with a continuous opening run parallel to the conductors 2 in the circuit-breaker 1 which are subsequently guided through the mounting elements 17.

In a manner corresponding to the number of phases, the housing 10 comprises three sections 19, 20, 21 which are connected to one another, each housing section 19, 20, 21 at least partially having a cylindrical shape. In the embodiment illustrated in FIG. 2, the two outer sections 19, 21 of the housing 10 are thus more than 50 percent cylindrical and are virtually 75 percent cylindrical in the embodiment illustrated in FIG. 3, which is why the side walls 16 of the housing 10 have plate-shaped mounting rails 22 for mounting the housing 10 in corresponding receiving grooves (not depicted) of the switching device 1. The shape of the housing base 15 is substantially determined by the cylindrical shape of the sections 19, 20, 21. In this case, the sections 19, 20, 21 merge into one another directly, as in the embodiment illustrated in FIG. 3, or via a flat connecting piece 23, as in the embodiment illustrated in FIG. 2.

The recesses 24 formed thereby or the ribs (not illustrated) additionally fitted to the housing base 15 are used to channel the exhaust gas flow produced in the event of a short circuit out of the circuit-breaker 1 in an optimized manner. The housing cover 14 is flat. Ribs 25 which are produced from housing material project from the rear wall 13 of the housing 10, said ribs each being placed in pairs between the conductors 2, which emerge from the housing 10 in the final mounting state and are in the form of busbars, and being used to comply with the required air gaps and leakage paths between the main current paths, see FIG. 3.

A holder 26 which is arranged close to the housing front side 18 on the housing cover 14 and is in the form of a bridge is used to fasten the connection lines (not illustrated) of the Rogowski coil 11 and of the current transformer 12 which subsequently project from the filling material, with the result that said lines remain in the intended position until the filling material hardens. The connection lines (not illustrated) connected to the ends of the secondary windings (not illustrated) of the Rogowski coil 11 and of the current transformer 12 are connected to a connecting plug 27. This connecting plug 27 makes it possible to electrically connect the combination converter module 8 to the electronic module 5 of the electronic tripping unit 6 of the circuit-breaker 1 via a connecting line 7.

The combination converter module 8 has a Rogowski coil 11 and a current transformer 12 for each phase. Each Rogowski coil 11 has an annular wound plastic or ceramic core and each current transformer 12 has an annular wound toroidal tape iron core, with the result that a continuous opening 36 is respectively formed. When assembling the combination converter module 8, a Rogowski coil 11 and a current transformer 12 are respectively pushed onto a mounting element 17. In this case, a plastic disk 28 which is used as a spacer is arranged between the Rogowski coil 11 and the current transformer 12, which disk is used for contact protection.

For mounting on the mounting element 17, the plastic disk 28 has a central opening 29, the diameter of which corresponds substantially to the external diameter of the mounting element 17. A further plastic disk 28 which has the same structure in the present case is placed on that outer side 35 of the current transformer 12 which faces the housing front side 18 and is opposite the Rogowski coil. The current transformer 12 is thus protected against contact on both sides.

The plastic disks 28 have three fastening elements in the form of clamping jaws 30 which, at a uniform distance from one another, extend from the edge of a first opening, which is made in the plastic disk 28 and has a relatively large diameter, in the direction of the center of the disk and define, with their free ends 31, the diameter of the resultant usable opening 29 with a smaller diameter, with the result that the plastic disks 28 simultaneously secure the installation position of the Rogowski coil 11 and of the current transformer 12 against slipping in the state mounted on the mounting element 17. For constant accuracy of the current measurement, it has proven to be particularly advantageous to insert the Rogowski coils 11 into the housing 10 first, with the result that said coils rest against the housing rear wall 13. This achieves particularly reliable support in the installation position even during the subsequent filling of the housing 10 with potting compound.

FIG. 4 illustrates an alternative plastic disk 28 which is used as a spacer and, in another embodiment of the invention, takes the place of the spacer arranged between the Rogowski coil 11 and the current transformer 12. The alternative plastic disk 28 does not have any fastening elements, with the result that the installation position of the Rogowski coil 11 and of the current transformer 12 is effected in this case solely by means of the second, front plastic disk 28. However, the alternative plastic disk 28 has a first holder 37 which is arranged close to the periphery of the disk, projects vertically from the disk surface, rests against the periphery of the Rogowski coil 11 or engages around the Rogowski coil 11 in the mounted state and has receiving openings or guides 38 for the connection end of a thin electrical connection line, which is guided out of the Rogowski coil 11, on the one hand, and for the connection end of a connecting line to the electronic module 5, on the other hand.

The alternative plastic disk 28 also has a second holder 37 (not visible in FIG. 4) which is identical to the first holder 37 and is arranged in a mirror-symmetrical manner with respect to the latter such that it points in the opposite direction and rests against the periphery of the current transformer 12 or engages around the current transformer 12 in the installed state. As a result of the fact that the connection ends are securely held in the holders 37, mechanical soldering of the connection ends is enabled. The holders 37 may also be designed to carry out a crimp connection between the connection ends. However, the plastic disk 28 need not have two holders 37. An embodiment with only one holder 37, for example a holder associated only with the Rogowski coil, is also likewise possible.

After the Rogowski coils 11, current transformers 12 and plastic disks 28 have been inserted into the housing 10, the housing 10 is filled with a potting compound. FIG. 3 illustrates the combination converter module 8 in the state ready for operation, but the potting compound is not illustrated for reasons of clarity. The three conductors 2 which are guided through the housing 10 and, at both ends, are provided with connection contacts 32, 33 for connection to the main current path of the circuit-breaker 1 have a circular cross section over the length of their passage through the housing. The internal diameter of the mounting elements 17 is preferably adapted to the external diameter of the conductors 2.

In the state ready for operation, the potting compound fills the intermediate spaces 34 between the Rogowski coils 11 and the current transformers 12 and between the latter and the housing cover 14, the housing base 15, the rear wall 13 of the housing and the housing side walls 16 and completely covers the plastic disks 28 on the end faces, with the result that it completely closes the housing 10 to the front. As an alternative to using a potting compound, it is possible to use another filling material, for example an insulating material to be inserted into the housing 10. In another refinement, a plastic cover can be applied to the housing 10 and can be fixed by means of a plug connection or ultrasonic welding or the like.

It is, in principle, possible to use other sensors, rather than Rogowski coils 11, to measure the primary currents. These may be, for example, an iron-cored current transformer or a Hall sensor. If these other sensors likewise have a preferably annular core, the design-related advantages during installation in the housing 10 can also be transferred to these further sensors.

The example embodiment described above describes a three-pole combination converter arrangement. Two-pole and four-pole embodiments etc. are also analogously possible. It goes without saying that it is likewise possible to implement the design shown in a single-pole embodiment.

Although the invention was described and illustrated in more detail using the preferred example embodiment, the invention is not restricted to the examples disclosed and other variations can be derived by a person skilled in the art without departing from the scope of protection of the invention.

The example embodiment or each example embodiment should not be understood as a restriction of the invention. Rather, numerous variations and modifications are possible in the context of the present disclosure, in particular those variants and combinations which can be inferred by the person skilled in the art with regard to achieving the object for example by combination or modification of individual features or elements or method steps that are described in connection with the general or specific part of the description and are contained in the claims and/or the drawings, and, by way of combinable features, lead to a new subject matter or to new method steps or sequences of method steps, including insofar as they concern production, testing and operating methods.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims.

Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program, tangible computer readable medium and tangible computer program product. For example, of the aforementioned methods may be embodied in the form of a system or device, including, but not limited to, any of the structure for performing the methodology illustrated in the drawings.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A combination converter arrangement, comprising:
   a plurality of combination converters arranged in a common housing, each combination converter including a Rogowski coil and a current transformer,
   wherein the housing includes, for each phase, a mounting element through which an electrical conductor associated with the respective phase runs and which is used as a carrier for the Rogowski coil and the current transformer of the combination converter associated with this phase,
   wherein no partitions are provided between the phases in the housing, and
   wherein the housing is filled with an electrically non-conductive filling material.

2. The combination converter arrangement of claim 1, wherein the Rogowski coil of each combination converter includes an annular wound plastic or ceramic core, and wherein the current transformer of each combination converter includes an annular wound core made of a ferromagnetic material.

3. The combination converter arrangement of claim 1, wherein the Rogowski coil is arranged on the mounting element in such a manner that it rests against the rear wall of the housing.

4. The combination converter arrangement of claim 1, wherein at least one of
   a spacer is arranged between the Rogowski coil and the current transformer of each combination converter, and
   a spacer is arranged on at least one of an outer side of the Rogowski coil and the outer side of the current transformer of each combination converter.

5. The combination converter arrangement of claim 4, wherein the at least one of the spacer arranged between the Rogowski coil and the current transformer each combination converter and the spacer arranged on at least one of the outer side of the Rogowski coil and the outer side of the current transformer of each combination converter is provided with at least one of
   fastening elements for holding the Rogowski coil and the current transformer in their installation position in the housing and
   a holder for connection ends of electrical connection lines.

6. A switching device, comprising:
   an electrical tripping unit, the electrical tripping unit including a combination converter arrangement of claim 1.

7. The switching device of claim 6, wherein each combination converter of the combination converter arrangement is associated with a phase of the switching device.

8. The switching device of claim 6, wherein the Rogowski coil of each combination converter is used to measure the primary current, and wherein the current transformer of each combination converter is designed to supply energy to the electronic module of the electronic tripping unit.

9. The combination converter arrangement of claim 2, wherein the housing includes, for each phase, a mounting element through which an electrical conductor associated with the respective phase runs and which is used as a carrier for the Rogowski coil and the current transformer of the combination converter associated with this phase.

10. The combination converter arrangement of claim 9, wherein the Rogowski coil is arranged on the mounting element in such a manner that it rests against the rear wall of the housing.

11. The switching device of claim 6, wherein the switching device is a low-voltage circuit-breaker.

12. The switching device of claim 7, wherein the Rogowski coil of each combination converter is used to measure the primary current, and wherein the current transformer of each combination converter is designed to supply energy to the electronic module of the electronic tripping unit.

13. The combination converter arrangement of claim 3, wherein the housing includes a top, bottom and side walls extending from the rear wall that enclose the plurality of combination converters.

14. The combination converter arrangement of claim 3, wherein the mounting element protrudes from the rear wall.

15. The combination converter arrangement of claim 1, wherein each mounting element extends through the Rogowski coil and the current transformer of each respective combination converter.

* * * * *